United States Patent
Gao

(10) Patent No.: US 12,014,950 B2
(45) Date of Patent: Jun. 18, 2024

(54) METHOD FOR FORMING SEMICONDUCTOR STRUCTURE AND SEMICONDUCTOR STRUCTURE

(71) Applicant: CHANGXIN MEMORY TECHNOLOGIES, INC., Hefei (CN)

(72) Inventor: Shang Gao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 420 days.

(21) Appl. No.: 17/446,290

(22) Filed: Aug. 27, 2021

(65) Prior Publication Data

US 2022/0102194 A1 Mar. 31, 2022

Related U.S. Application Data

(63) Continuation of application No. PCT/CN2021/105522, filed on Jul. 9, 2021.

(30) Foreign Application Priority Data

Sep. 30, 2020 (CN) .......................... 202011056573.8

(51) Int. Cl.
*H01L 21/762* (2006.01)
*H01L 21/02* (2006.01)
*H01L 29/06* (2006.01)

(52) U.S. Cl.
CPC .. *H01L 21/76224* (2013.01); *H01L 21/02164* (2013.01); *H01L 21/0217* (2013.01); *H01L 21/0228* (2013.01); *H01L 21/02315* (2013.01); *H01L 29/0649* (2013.01)

(58) Field of Classification Search
None
See application file for complete search history.

(56) References Cited

U.S. PATENT DOCUMENTS

| | | | |
|---|---|---|---|
| 6,235,651 B1 | 5/2001 | Schrems et al. | |
| 8,207,065 B2 | 6/2012 | Liao | |
| 10,153,210 B1 | 12/2018 | Lin et al. | |
| 10,347,456 B1 * | 7/2019 | Ok | H01J 21/105 |
| 10,446,448 B2 | 10/2019 | Lin et al. | |
| 10,658,369 B2 | 5/2020 | Chen et al. | |
| 2009/0029556 A1 | 1/2009 | Liao | |
| 2009/0256233 A1 * | 10/2009 | Eun | H01L 21/76229 |
| | | | 257/E21.548 |
| 2018/0358266 A1 | 12/2018 | Lin et al. | |

(Continued)

FOREIGN PATENT DOCUMENTS

CN 102569165 B 7/2016
CN 110431660 A 11/2019

*Primary Examiner* — Asok K Sarkar
(74) *Attorney, Agent, or Firm* — Syncoda LLC; Feng Ma

(57) ABSTRACT

A method for forming a semiconductor structure includes the following steps: providing a substrate having a trench in a surface; forming an isolation layer on the surface of the substrate, the isolation layer covering a side wall and a bottom wall of the trench; pretreating the isolation layer such that an initial oxide layer is formed on a surface of the isolation layer; forming an advanced oxide layer on a surface of the initial oxide layer with an atomic layer deposition process; and forming a dielectric layer on a surface of the advanced oxide layer with a spin-on dielectrics (SOD) process such that the dielectric layer fills the trench.

14 Claims, 3 Drawing Sheets

(56) References Cited

U.S. PATENT DOCUMENTS

2019/0067118 A1 2/2019 Lin et al.
2019/0378844 A1 12/2019 Chen et al.
2020/0243541 A1 7/2020 Chen et al.

* cited by examiner

METHOD FOR FORMING SEMICONDUCTOR STRUCTURE AND SEMICONDUCTOR STRUCTURE

CROSS-REFERENCE TO RELATED APPLICATIONS

This is a continuation of International Patent Application No. PCT/CN2021/105522 filed on Jul. 9, 2021, which claims priority to Chinese Patent Application No. 202011056573.8 filed on Sep. 30, 2020. The disclosures of these applications are hereby incorporated by reference in their entirety.

BACKGROUND

An existing dynamic random-access memory (DRAM) process proposes using a spin-on dielectrics (SOD) process to fill a trench. In the above process, silicon nitride (SiN) is used to form an isolation layer on a side wall of the trench, and then a layer of silicon dioxide ($SiO_2$) is deposited on a surface of the isolation layer. The silicon dioxide can adhere to silicon nitride and SOD formed in the subsequent process.

SUMMARY

The disclosure relates generally to the technical field of semiconductors and preparation processes thereof, and more specifically to a method for forming a semiconductor structure, and a semiconductor structure.

According to one aspect of the embodiments of the disclosure, a method for forming a semiconductor structure is provided, including the following steps: providing a substrate having a trench in a surface of the substrate; forming an isolation layer on the surface of the substrate, the isolation layer covering a side wall and a bottom wall of the trench; pretreating the isolation layer such that an initial oxide layer is formed on a surface of the isolation layer; forming an advanced oxide layer on a surface of the initial oxide layer with an atomic layer deposition process; and forming a dielectric layer on a surface of the advanced oxide layer with a spin-on dielectrics (SOD) process such that the dielectric layer fills the trench.

According to another aspect of the embodiments of the disclosure, a semiconductor structure is provided. The semiconductor structure includes a substrate having a trench in a surface of the substrate. An inner surface of the trench is provided with an isolation layer, an initial oxide layer, an advanced oxide layer and a dielectric layer in sequence. The dielectric layer fills the trench. The initial oxide layer is formed on a surface of the isolation layer by pretreatment with plasma oxygen.

REFERENCE NUMERALS ARE DESCRIBED BELOW

Figure 1:
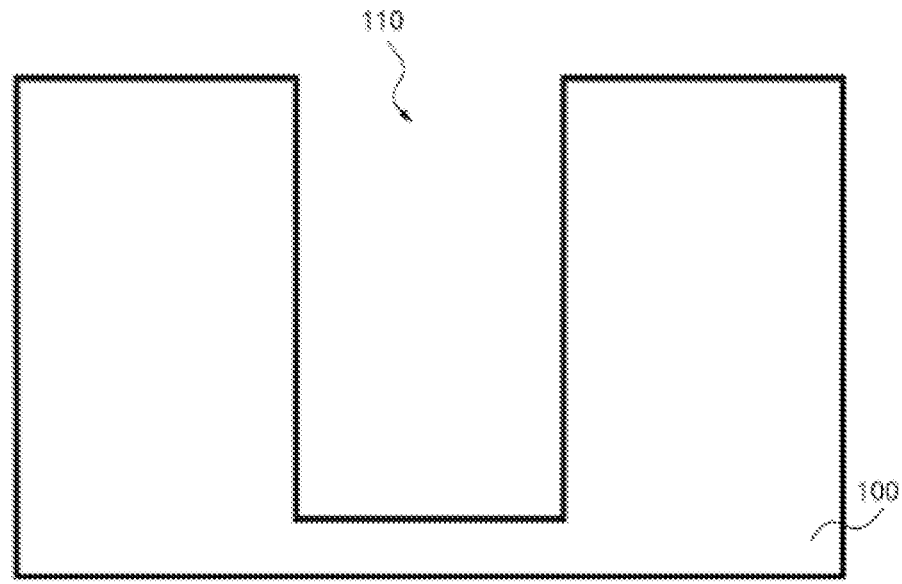
FIG. 1 is a schematic structural diagram of a semiconductor structure in one step of a method for forming a semiconductor structure illustrated according to one exemplary implementation.

100: substrate;
110: trench;
200: isolation layer;
300: advanced oxide layer;
310: initial oxide layer;
400: dielectric layer.

DETAILED DESCRIPTION

Example implementations will be now described more comprehensively with reference to the accompanying drawings. However, the example implementations can be implemented in a variety of forms and should not be construed as being limited to the implementations set forth herein. Rather, these implementations are provided to make the disclosure more comprehensive and complete, and fully convey the concept of the example implementations to those skilled in the art. The same reference signs in the drawings denote the same or similar structures, and a repetitive description thereof will be omitted.

In typical processes, the silicon dioxide is deposited on a surface of silicon nitride through an atomic layer deposition (ALD) process. Since the surface bonding of the silicon nitride and the surface bonding of the silicon dioxide are different, specifically, the surface bonding of the silicon nitride is Si—N, while the surface bonding of the silicon dioxide is Si—O, which will affect the saturated adsorption of the silicon dioxide during the deposition process. As a result, the deposition of silicon dioxide is between ALD and chemical vapor deposition (CVD), and is not a complete ALD, leading to poor thin film uniformity of silicon dioxide in the first few cycles of the deposition process. Subsequent cycle pages will continue to grow along the previous silicon dioxide thin film, and the crossed thin film uniformity will be inherited into the subsequent thin film structure.

Therefore, due to the poor uniformity of the silicon dioxide in the above-mentioned existing process, the filling of the SOD in the subsequent manufacturing process will be affected, causing a void defect of the SOD.

Referring to FIG. 1 to FIG. 5, schematic structural diagrams of a semiconductor structure in several steps of a method for forming a semiconductor structure provided in the disclosure are representatively illustrated. In this exemplary implementation, a method for forming a semiconductor structure provided in the disclosure is described by taking application to a semiconductor memory assembly as an example. It is easy for those skilled in the art to understand that, in order to apply the relevant design of the disclosure to other types of semiconductor structures or other processes, various modifications, additions, substitutions, deletions or other changes are made to the following specific implementations. These changes are still within the scope of the principle of the method for forming a semiconductor structure provided in the disclosure.

As shown in FIG. 1 to FIG. 5, in the present implementation, the method for forming a semiconductor structure provided in the disclosure includes the following steps.

A substrate 100 is provided, and a trench 110 is provided in a surface of the substrate 100.

An isolation layer 200 is formed on the surface of the substrate 100, and covers a side wall and a bottom wall of the trench 110.

The isolation layer 200 is pretreated such that an initial oxide layer 310 is formed on a surface of the isolation layer 200.

An advanced oxide layer 300 is formed on a surface of the initial oxide layer 310 with an atomic layer deposition process.

A dielectric layer 400 is formed on a surface of the advanced oxide layer 300 with a spin-on dielectrics (SOD) process such that the dielectric layer 400 fills the trench 110.

As shown in FIG. 1, a schematic structural diagram of a semiconductor structure in the step of "providing a substrate 100" of the method for forming a semiconductor structure is representatively illustrated. Specifically, in the present implementation, the semiconductor structure in this step includes the substrate 100, and a trench is formed in the surface of the substrate 100. The trench shown in the figure is substantially rectangular. In various possible exemplary implementations conforming to the design idea of the disclosure, the trench can also be of other shapes, such as trapezoid, which is not limited by the present implementation.

Figure 2:
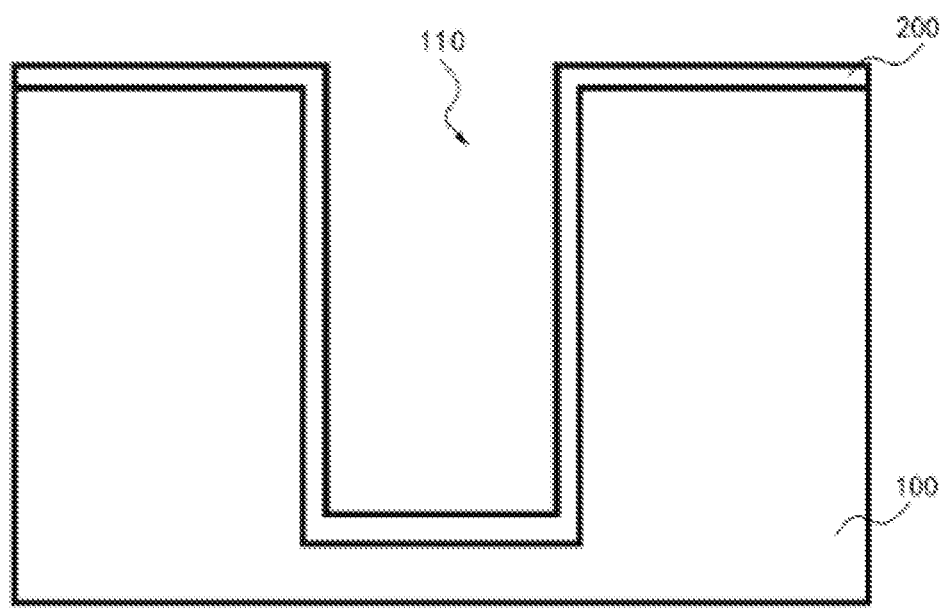
FIG. 2 is a schematic structural diagram of a semiconductor structure in another step of a method for forming a semiconductor structure illustrated according to one exemplary implementation.

As shown in FIG. 2, a schematic structural diagram of a semiconductor structure in the step of "forming an isolation layer 200" of the method for forming a semiconductor structure is representatively illustrated. Specifically, in the present implementation, the semiconductor structure in this step includes the substrate 100 and the isolation layer 200. The isolation layer 200 is formed on the surface of the substrate 100, and covers the side wall and the bottom wall of the trench.

Optionally, in the present implementation, a material of the isolation layer 200 can include silicon nitride.

Figure 3:
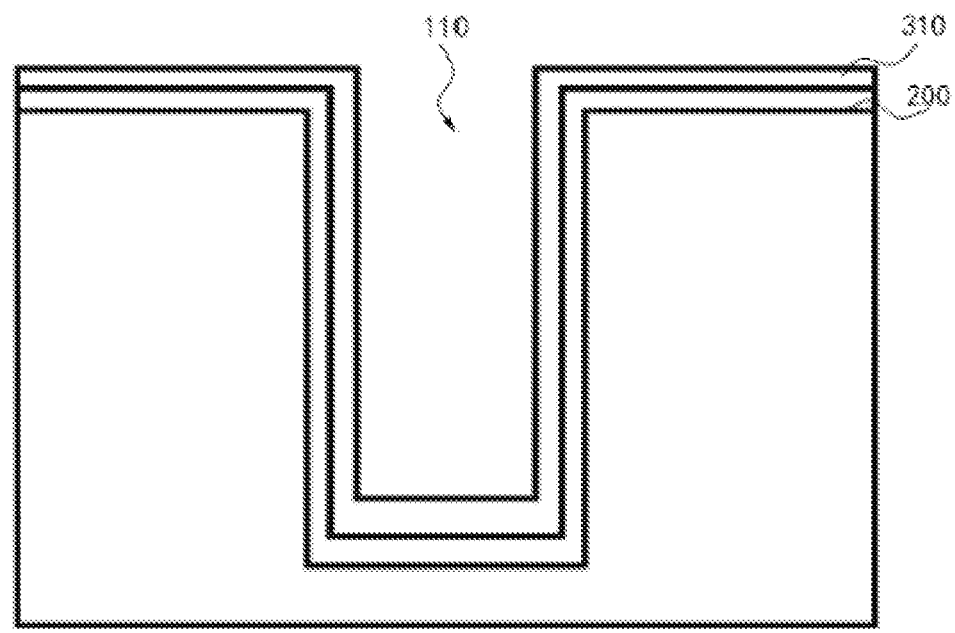
FIG. 3 is a schematic structural diagram of a semiconductor structure in another step of a method for forming a semiconductor structure illustrated according to one exemplary implementation.

As shown in FIG. 3, a schematic structural diagram of a semiconductor structure in the step of "forming an initial oxide layer 310" of the method for forming a semiconductor structure is representatively illustrated. Specifically, in the present implementation, the semiconductor structure in this step includes the substrate 100, the isolation layer 200 and the initial oxide layer 310. The initial oxide layer 310 is formed on the surface of the isolation layer 200, and covers the side wall and the bottom wall of the trench (which are covered by the isolation layer 200).

Optionally, for the step of "forming an initial oxide layer 310", in the present implementation, the process of pretreating the isolation layer 200 includes the following. The surface of the isolation layer 200 is pretreated by plasma oxygen such that the initial oxide layer 310 is formed on the surface of the isolation layer 200.

Further, based on the process design of the pretreatment process including the pretreatment with plasma oxygen, for the step of "forming an initial oxide layer 310", in the present implementation, radio frequency power for forming the plasma oxygen can be 80 W to 120 W, such as 80 W, 90 W, 100 W, 110 W, 120 W, etc. In other implementations, the radio frequency power for forming the plasma oxygen can also be less than 80 W, or can be greater than 120 W, such as 75 W, 125 W, etc., which is not limited by the present implementation.

Further, based on the process design of the pretreatment process including the pretreatment the plasma oxygen, for the step of "forming an initial oxide layer 310", in the present implementation, a flow velocity of the plasma oxygen can be 2 slm to 10 slm, such as 3 slm, 5 slm, 7 slm, or 9 slm. In other implementations, the flow velocity of plasma oxygen can also be less than 2 slm, or can be greater than 10 slm, such as 1.9 slm, 11 slm, etc., and is not limited by the present implementation.

Optionally, for the step of "forming an initial oxide layer 310", in the present implementation, the initial oxide layer 310 can be formed on the surface of the isolation layer 200 with a plurality of cycles of pretreatment with the plasma oxygen.

Further, for the step of "forming an initial oxide layer 310", based on the process design of forming the initial oxide layer 310 with a plurality of cycles of pretreatment with the plasma oxygen, in the present implementation, in the step of forming an initial oxide layer 310, the number of cycles of the pretreatment with the plasma oxygen can be 2 to 5, such as 2, 3, 4, 5, etc. In other implementations, the number of cycles of the pretreatment with the plasma oxygen can be greater than 5, such as 6, 7, etc., which can be specifically flexibly adjusted according to a thickness of the initial oxide layer 310 to be deposited or other process requirements. The number is not limited by the present implementation.

Further, for the step of "forming an initial oxide layer 310", based on the process design of forming the initial oxide layer 310 with a plurality of cycles of pretreatment with the plasma oxygen, in the present implementation, in the step of forming an initial oxide layer 310, the duration of a single cycle of the pretreatment with the plasma oxygen can be 5 min to 15 min, such as 5 min, 8 min, 10 min, 15 min, etc. In other implementations, the duration of a single cycle of the pretreatment with the plasma oxygen can be less than 5 min or greater than 15 min, such as 4 min or 18 min, etc., which can be specifically flexibly adjusted according to a thickness of the initial oxide layer 310 to be deposited or other process requirements. The number is not limited by the present implementation.

Further, for the step of "forming an initial oxide layer 310", based on the process design of forming the initial oxide layer 310 with a plurality of cycles of pretreatment with the plasma oxygen, in the present implementation, in the step of forming an initial oxide layer 310, there can be 3 process cycles of the pretreatment with the plasma oxygen, and the duration of each cycle can be greater than 10 min.

Optionally, for the step of "forming an initial oxide layer 310", in the present implementation, the material of the initial oxide layer 310 can include silicon dioxide.

Figure 4:
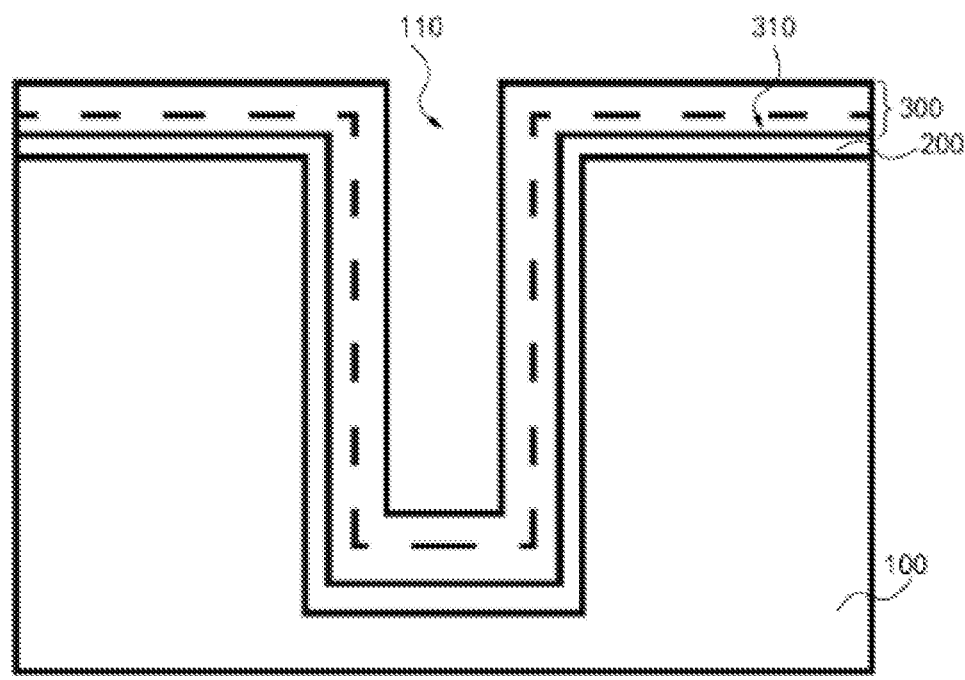
FIG. 4 is a schematic structural diagram of a semiconductor structure in another step of a method for forming a semiconductor structure illustrated according to one exemplary implementation.

As shown in FIG. 4, a schematic structural diagram of a semiconductor structure in the step of "forming an advanced oxide layer 300" of the method for forming a semiconductor structure is representatively illustrated. Specifically, in the present implementation, the semiconductor structure in this step includes the substrate 100, the isolation layer 200 and the advanced oxide layer 300 (including the initial oxide layer 310). The advanced oxide layer 300 is formed on the surface of the isolation layer 200, and covers the side wall and the bottom wall of the trench (which are covered by the isolation layer 200).

Optionally, for the step of "forming an advanced oxide layer 300", in the present implementation, a material of the advanced oxide layer 300 can include silicon dioxide.

According to the above, in the present implementation, the materials of the initial oxide layer 310 and the advanced oxide layer 300 both include silicon dioxide, that is, the material of the initial oxide layer 310 and the material of the advanced oxide layer 300 can be the same. On the basis of this, the initial oxide layer 310 and the advanced oxide layer 300 can jointly form an oxide material layer covering the surface of the isolation layer 200. That is, the design idea of the disclosure can be understood that when the advanced oxide layer 300 is provided on the isolation layer 200, the initial oxide layer 310 is formed on the surface of the isolation layer 200 with the pretreatment of the plasma oxygen, and then deposition is continued (atomic layer deposition (ALD) or other existing processes can be used) on an oxide material to form the advanced oxide layer 300, that is, to form an oxide material layer including the initial oxide layer 310 and the advanced oxide layer 300.

Optionally, for the step of "forming an advanced oxide layer 300", in the present implementation, a plurality of layers of oxide materials can be deposited on the surface of the initial oxide layer 310 through a plurality of cycles to form the advanced oxide layer 300. The number of cycles of the forming process of the advanced oxide layer 300 and the duration of a single cycle can be flexibly adjusted according to the thickness of the advanced oxide layer 300 needing to be formed or other process requirements.

Optionally, for the step of "forming an advanced oxide layer 300", in the present implementation, a ratio of the thickness of the initial oxide layer 310 to the thickness of the advanced oxide layer 300 can be 1:5 to 1:20, such as 1:5, 1:9, 1:13, 1:20, etc. According to the above, compared with the advanced oxide layer 300, a thin film structure can be called a "very thin" thin film structure, which can achieve the effect of improving the growth uniformity of the subsequent advanced oxide layer 300. In other implementations, the ratio of the thickness of the initial oxide layer 310 to the thickness of the advanced oxide layer 300 can also be less than 1:20, or can be greater than 1:5, such as 1:4, 1:25, etc., which is not limited by the present implementation.

Further, based on the process design that the ratio of the thickness of the initial oxide layer 310 to the thickness of the advanced oxide layer 300 can be 1:5 to 1:20, for the step of "forming an advanced oxide layer 300", in the present implementation, the ratio of the thickness of the initial oxide layer 310 to the thickness of the advanced oxide layer 300 can further be 1:10.

Figure 5:
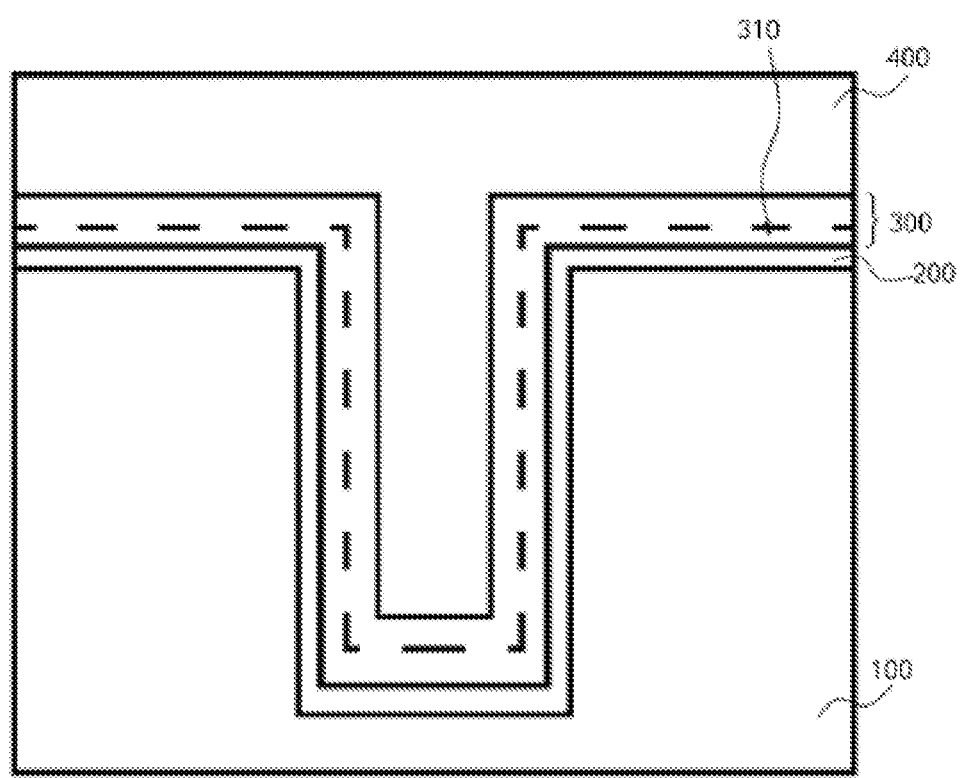
FIG. 5 is a schematic structural diagram of a semiconductor structure in another step of a method for forming a semiconductor structure illustrated according to one exemplary implementation.

As shown in FIG. 5, a schematic structural diagram of a semiconductor structure in the step of "forming a dielectric layer 400" of the method for forming a semiconductor structure is representatively illustrated. Specifically, in the present implementation, the semiconductor structure in this step includes the substrate 100, the isolation layer 200, the advanced oxide layer 300 (including the initial oxide layer 310), and the dielectric layer 400. The dielectric layer 400 is formed on a surface of the advanced oxide layer 300 with a SOD process such that the dielectric layer 400 fills the trench.

It should be noted here that the method for forming the semiconductor structure shown in the drawings and described in the present specification are only a few examples of many trench filling methods that can adopt the principles of the disclosure. It should be clearly understood that the principle of the disclosure is by no means limited to any details or any steps of the method for forming the semiconductor structure shown in the accompanying drawings or described in the present specification.

Based on the above detailed description of one exemplary implementation of the method for forming the semiconductor structure provided in the disclosure, one exemplary implementation of a semiconductor structure provided in the disclosure will be described below in conjunction with FIG. 5.

As shown in FIG. 5, in the present implementation, the semiconductor structure provided in the disclosure includes the substrate 100 having a trench 110 in a surface of the substrate 100. An isolation layer 200, an initial oxide layer 310, an advanced oxide layer 300 and a dielectric layer 400 are sequentially provided on the surface of the substrate 100. The dielectric layer 400 fills the trench 110. The initial oxide layer 310 is formed on the surface of the isolation layer 200 with pretreatment of plasma oxygen.

Optionally, as shown in FIG. 5, in the present implementation, the initial oxide layer 310 can include the same material as the advanced oxide layer 300. According to this, the advanced oxide layer 300 of the semiconductor structure can be understood as including the initial oxide layer 310, that is, the initial oxide layer 310 is a layer of thin film structure of a special oxide material formed by pretreatment with the plasma oxygen when the advanced oxide layer 300 is initially deposited, which can achieve the effect of improving the growth uniformity of the subsequent advanced oxide layer 300.

It should be noted here that the semiconductor structures shown in the drawings and described in the present specification are only a few examples of many types of semiconductor structures that can adopt the principles of the disclosure. It should be clearly understood that the principle of the disclosure is by no means limited to any details or any structures of the semiconductor structure shown in the accompanying drawings or described in the present specification.

In conclusion, in the method for forming the semiconductor structure provided by the disclosure, the surface of the isolation layer is first pretreated to form the initial oxide layer, and the advanced oxide layer is deposited and formed on the surface of the initial oxide layer. With the above-mentioned process design, the initial oxide layer formed by pretreatment in the disclosure can allow the advanced oxide layer to uniformly grow in the subsequent manufacturing process, thereby reducing a void defect in a spin-on filling process of dielectrics.

Although the disclosure has been described with reference to a few typical embodiments, it should be understood that the terms used are illustrative and exemplary rather than restrictive. Since the disclosure can be implemented in various forms without departing from the spirit or essence of the disclosure, it should be understood that the above-mentioned embodiments are not limited to any of the foregoing details, but should be interpreted broadly within the spirit and scope defined by the appended claims. Therefore, all changes and modifications falling within the scope of the claims or their equivalents shall be covered by the appended claims.

What is claimed is:

1. A method for forming a semiconductor structure, comprising
steps of:
providing a substrate having a trench in a surface of the substrate;
forming an isolation layer on the surface of the substrate, the isolation layer covering a side wall and a bottom wall of the trench;
pretreating the isolation layer such that an initial oxide layer is formed on a surface of the isolation layer;

forming an advanced oxide layer on a surface of the initial oxide layer with an atomic layer deposition process; and forming a dielectric layer on a surface of the advanced oxide layer with a spin-on dielectrics (SOD) process such that the dielectric layer fills the trench.

2. The method for forming the semiconductor structure of claim 1, wherein
the step of pretreating the isolation layer comprises: pretreating a surface of the isolation layer by using plasma oxygen to form an initial oxide layer on the surface of the isolation layer.

3. The method for forming the semiconductor structure of claim 2, wherein
in the step of forming the initial oxide layer, radio frequency power of the plasma oxygen is 80 W to 120 W.

4. The method for forming the semiconductor structure of claim 2, wherein
in the step of forming the initial oxide layer, a flow velocity of the plasma oxygen is 2 slm to 10 slm.

5. The method for forming the semiconductor structure of claim 2, wherein
in the step of forming the initial oxide layer, the initial oxide layer is formed on the surface of the isolation layer with a plurality of cycles of pretreatment with the plasma oxygen on the surface of the isolation layer.

6. The method for forming the semiconductor structure of claim 5, wherein
in the step of forming the initial oxide layer, the plurality of cycles of the pretreatment with the plasma oxygen is 2 to 5.

7. The method for forming the semiconductor structure of claim 5, wherein
in the step of forming the initial oxide layer, a duration of each cycle of the pretreatment with the plasma oxygen is 5 min to 15 min.

8. The method for forming the semiconductor structure of claim 1, wherein
a material of the initial oxide layer is same as a material of the advanced oxide layer.

9. The method for forming the semiconductor structure of claim 1, wherein
in the step of forming the advanced oxide layer, a plurality of layers of oxide materials are deposited on a surface of the oxide thin film structure with a plurality of cycles of atomic layer deposition, so as to form the advanced oxide layer.

10. The method for forming the semiconductor structure of claim 1, wherein
a ratio of a thickness of the initial oxide layer to a thickness of the advanced oxide layer is 1:5 to 1:20.

11. The method for forming the semiconductor structure of claim 10, wherein
the ratio of the thickness of the initial oxide layer to the thickness of the advanced oxide layer is 1:10.

12. The method for forming the semiconductor structure of claim 1, wherein
a material of the initial oxide layer comprises silicon dioxide.

13. The method for forming the semiconductor structure of claim 1, wherein
a material of the advanced oxide layer comprises silicon dioxide.

14. The method for forming the semiconductor structure of claim 1, wherein
a material of the isolation layer comprises silicon nitride.

* * * * *